United States Patent
Suga et al.

(10) Patent No.: US 7,301,243 B2
(45) Date of Patent: Nov. 27, 2007

(54) HIGH-RELIABLE SEMICONDUCTOR DEVICE USING HERMETIC SEALING OF ELECTRODES

(75) Inventors: Tadatomo Suga, Nakano-ku (JP); Toshihiro Itoh, Chiba (JP)

(73) Assignees: Sharp Kabushiki Kaisha, Osaka (JP); Tadatoma Suga, Tokyo (JP); Oki Electric Industry Co., Ltd., Tokyo (JP); Sanyo Electric Co., Ltd., Osaka (JP); Sony Corporation, Tokyo (JP); Kabushiki Kaisha Toshiba, Tokyo (JP); NEC Corporation, Tokyo (JP); Fujitsu Limited, Kanagawa (JP); Matsushita Electric Industrial Co., Ltd., Osaka (JP); Renesas Technology Corp., Tokyo (JP); Rohm Co., Ltd., Kyoto (JP)

( * ) Notice: Subject to any disclaimer, the term of this patent is extended or adjusted under 35 U.S.C. 154(b) by 87 days.

(21) Appl. No.: 11/212,912

(22) Filed: Aug. 29, 2005

(65) Prior Publication Data

US 2006/0043604 A1    Mar. 2, 2006

(30) Foreign Application Priority Data

Aug. 30, 2004  (JP) ............................. 2004-250443

(51) Int. Cl.
*H01L 23/52* (2006.01)
*H01L 23/48* (2006.01)
*H01L 29/40* (2006.01)

(52) U.S. Cl. .............................. 257/778; 257/E23.021; 257/780; 257/686; 257/659; 310/344; 310/348; 333/247

(58) Field of Classification Search ........ 257/E23.024, 257/E23.065, 686, 660, 659, 778, 710, E21.499, 257/E21.511, E23.021, E23.193; 333/247; 310/344, 348, 363, 365
See application file for complete search history.

(56) References Cited

U.S. PATENT DOCUMENTS

| 4,893,172 A | 1/1990 | Matsumoto et al. ........ 174/254 |
| 5,508,228 A * | 4/1996 | Nolan et al. ................ 438/614 |

(Continued)

FOREIGN PATENT DOCUMENTS

EP    1 388 875    2/2004

(Continued)

OTHER PUBLICATIONS

"KR 2002-0083262" corresponds to U.S. 6,511,894 listed above.

(Continued)

*Primary Examiner*—Kenneth Parker
*Assistant Examiner*—Chris C. Chu
(74) *Attorney, Agent, or Firm*—Nixon & Vanderhye P.C.

(57) ABSTRACT

The present invention relates to a high-reliable semiconductor device in which electrodes formed on substrates are prevented from deteriorating by sealing the electrodes with a frame member rather than a sealing material. The frame member in the present invention surrounds electrodes formed on the substrates. The inside of the frame member is vacuous or filled with a gas which does not react with the electrodes such as an inert gas and, thereby, the electrodes are prevented from deteriorating by attacks of oxygen or moisture.

10 Claims, 4 Drawing Sheets

U.S. PATENT DOCUMENTS

| | | | |
|---|---|---|---|
| 5,539,220 A | 7/1996 | Takahashi | |
| 5,578,874 A * | 11/1996 | Kurogi et al. | 257/778 |
| 5,869,903 A * | 2/1999 | Nakatani et al. | 257/777 |
| 5,904,499 A * | 5/1999 | Pace | 438/108 |
| 6,405,592 B1 * | 6/2002 | Murari et al. | 73/493 |
| 6,498,422 B1 * | 12/2002 | Hori | 310/344 |
| 6,511,894 B2 | 1/2003 | Song | |
| 6,815,869 B2 * | 11/2004 | Baba et al. | 310/313 R |
| 6,982,380 B2 * | 1/2006 | Hoffmann et al. | 174/520 |
| 7,154,206 B2 * | 12/2006 | Shimada et al. | 310/313 R |
| 2004/0159960 A1 | 8/2004 | Fujiwara et al. | 257/783 |

FOREIGN PATENT DOCUMENTS

| | | |
|---|---|---|
| JP | 04-030544 | 2/1992 |
| JP | 07-147299 | 6/1995 |
| JP | 11-214447 A | 8/1999 |
| JP | 11-233669 A | 8/1999 |
| JP | 3116926 B2 | 10/2000 |
| JP | 2001-053106 | 2/2001 |
| JP | 2001-110845 | 4/2001 |
| JP | 2001-156091 A | 6/2001 |
| JP | 2001-320148 A | 11/2001 |

OTHER PUBLICATIONS

Korean Office Action dated Sep. 29, 2006.
"JP 2004-214469" corresponds to US 2004/0159960 listed above
Japanese Office Action dated Jun. 19, 2007.
Chinese Office Action dated Jul. 6, 2007.

* cited by examiner (a)

(b)

HIGH-RELIABLE SEMICONDUCTOR DEVICE USING HERMETIC SEALING OF ELECTRODES

FIELD OF THE INVENTION

The present invention relates to a high-reliable semiconductor device in which electrodes formed on substrates are prevented from deteriorating by sealing the electrodes with a frame member rather than a sealing material.

BACKGROUND OF THE INVENTION

Previously, in manufacturing a semiconductor device by mounting a semiconductor chip on a wiring board, a wire bonding technique has been employed in which bonding pads on a semiconductor chip and leads on a wiring board are electrically connected by bonding via thin metal wires. Recently, in order to cope with a requirement for downsizing and lightening electrical equipments and an increase in the number of connection terminals of a semiconductor device, a flip chip mounting technology is employed in which a projecting electrode (hereinafter referred to as a "bump"), is formed on an electrode on a surface of a semiconductor chip and, then, the semiconductor chip is directly bonded to a wiring board in a face down manner.

In this flip chip mounting technology, bumps are formed on a plurality of electrodes formed on a semiconductor chip by using a metallic material such as solder and Au, these bumps and corresponding electrodes formed on a wiring board are positioned, and they are bonded by heat-press. In order to enhance a reliability of a semiconductor, an underfill material, which functions as a sealing resin protecting electrodes from adverse environmental effects such as oxidation via oxygen or moisture and which functions as a thermal stress buffer material preventing destruction of bumps with a thermal stress caused by a difference in thermal expansion coefficients between the semiconductor chip and the wiring board during cooling after heat-press, is supplied between the semiconductor chip and the wiring board.

For supplying an underfill material, there are two methods: a method comprising heat-pressing a semiconductor chip on which bumps are formed on a wiring board and, then, filling a liquid resin between the semiconductor chip and the wiring board; and a method comprising supplying first a liquid resin or a resin film onto a wiring board and, then, bonding a semiconductor chip to the wiring board.

However, since any of the above methods requires a step for supplying an underfill material and there are restrictions such as storage and a use limit for the underfill material, problems occur such as a reduction in a working efficiency, a cost increase and the like.

In addition, from the view point how the environmental load is reduced, there is a problem that a product made by bonding many parts such as a mounting board in an electronics field is dismantled into the parts and these parts are recovered to recycle. However, when an underfill material is used, it is difficult to remove it during dismantlement.

Furthermore, due to thinning of a semiconductor device, as a gap between a semiconductor chip and a wiring board is getting narrower and a pitch between wirings formed on the board is getting narrower, it becomes difficult to fill a resin sufficiently between wirings.

Then, it is needed to consider a means for securing reliability of a semiconductor device by preventing electrodes on a semiconductor chip and a wiring board from deteriorating; and buffering a thermal stress between the semiconductor chip and the wiring board without using a resin such as an underfill material.

As a means for buffering a thermal stress between a semiconductor chip having bumps and a wiring board without using an underfill material, for example, Japanese Patent No. 3116926 discloses in its Specification a structure in which a low-elastic layer is provided beneath an area around bumps formed on a semiconductor chip to buffer a thermal stress.

In addition, a thermal stress is buffered by investing bumps themselves with elasticity. For example, JP-A No. 1999-214447 and JP-A No. 2001-156091 disclose a structure in which a thermal stress is buffered by forming a cavity within a solder bump. JP-A No. 1999-233669 discloses a structure in which a thermal stress is buffered by utilizing elasticity of a resin by forming a bump consisting of a resin core made of a photo-sensitive resin such as polyimide, acrylic and the like and Ni plating and the like on a surface of the core. JP-A No. 2000-320148 discloses a structure in which a thermal stress generated between an integrated circuit and a mounting board is buffered by utilizing a U-shape elastic element at solder joints.

Further, for bonding a fine pattern below a 10 µm pitch, since bump connecting becomes difficult and when heterogeneous materials exist in a joint, properties of the materials in the joint change due to a diffusion reaction during bonding so that reliability cannot be secured, a need arises to adopt a bumpless connection in which electrodes formed on a semiconductor chip and electrodes formed on a wiring board are directly contacted while excluding heterogeneous materials in the joint.

In the case where substrates made of the same material are bonded (e.g., Si chips are bonded or a Si chip is mounted on a Si interposer substrate), since a stress applied to a joint in a bumpless connection should be buffered by bending of both two substrates, these substrates are thinned as far as possible until they obtain elasticity.

Currently, Si thin wafers with a thickness of 50 µm are produced in a mass-production, and a wafer with a thickness of 30 µm or thinner has been developed.

In the above conventional technology, although a stress-buffering function as which an underfill material has can be achieved without using such an underfill material, a sealing function to prevent deterioration of electrodes has not been discussed.

Further, in a field of electronics, as problems from a short term viewpoint with respect to yielding improvement such as repairing and reworking, and problems from a long term viewpoint with respect to the basis of industry in a circular economic society such as recycling and reusing, a development of a technology for removably mounting has become considered important. However, since in a conventional mounting technology a semiconductor device is made by bonding electrodes on a semiconductor chip and electrodes on a wiring board, electrodes are destroyed when the semiconductor chip is removed from the wiring board and, thus, it is difficult to reuse the semiconductor chip and the wiring board.

SUMMARY OF THE INVENTION

Accordingly, an object of the present invention is to provide a semiconductor device in which a semiconductor chip is mounted on a wiring board, the semiconductor device being invested with a high reliability without using a sealing resin. Another object of the present invention is to provide a semiconductor device in which a semiconductor chip and a wiring board can be separated easily, while maintaining its high reliability.

The present invention provides a semiconductor device which comprises a first substrate on which one or more electrodes are formed, a second substrate on which one or more electrodes are formed, and a frame member, wherein each of the one or more electrodes formed on the first substrate and each of the one or more electrodes correspondingly formed on the second substrate are electrically connected;

wherein the frame member surrounds the electrodes formed on the first and the second substrates to hermetically seal these electrodes; and the first and the second substrates are bonded via the frame member.

In the present invention, a combination of a first substrate and a second substrate includes a Si substrate—a Si substrate (e.g., semiconductor chips, a semiconductor and an interposer), a Si substrate—a printed wiring board (including a flexible board), a Si substrate—a compound semiconductor substrate (a substrate of GaAs, InP, etc.), a compound semiconductor substrate—a printed wiring board and the like. In the above combination, any substrate may be considered as a first substrate.

In a semiconductor device of the present invention, the inside of this frame member is vacuous or either of a nitrogen gas or an inert gas or a mixture thereof is enclosed within the inside. Thereby, electrodes formed on the semiconductor chip and the wiring board are protected so as not to deteriorate by attacks of oxygen or moisture to prevent a destruction of an electrical connection.

In the present invention, a term "vacuous" or "in vacuo" means a condition where an air pressure is below an atmospheric pressure. Additionally, examples of an inert gas include a rare gas such as argon and the like.

The semiconductor device of the present invention is characterized in that electrical connections between each of the one or more electrodes formed on the first substrate and each of the one or more electrodes correspondingly formed on the second substrate are achieved without bonding these electrodes.

In addition, the semiconductor device of the present invention is characterized in that the frame member is removably bonded to at least one of the first and the second substrates.

In the present invention, since electrical connection is achieved only by contacting electrodes formed on the semiconductor chip and electrodes formed on the wiring board without bonding these electrodes, when the semiconductor chip and the wiring board is removably bonded via the frame member, the semiconductor device can be dismantled without destroying electrodes. Thus, it is advantageous to carry out repairing or recycling of semiconductor devices.

In addition, as described above, in the semiconductor device of the present invention, since electrodes are hermetically sealed with a frame member, even when electrodes on a semiconductor chip and electrodes on a wiring board are electrically connected only by contacting, contact parts of the electrodes will not deteriorate by oxygen or moisture to destroy an electrical connection.

A method for bonding a frame member depends on materials for the frame member and a substrate to which the frame member is bonded, but any bonding method may be used as far as the frame member can be removably bonded. For example, the frame member may be bonded with solder.

Thus, the semiconductor chip can be removed from the wiring board without destroying electrodes and the wiring board and the chip can be reused.

In the semiconductor device of the present invention, surfaces of the electrodes formed on the first and the second substrates may be cleaned.

In the present invention, since electrical connection is achieved, it is effective that contacting surfaces are cleaned by removing oxides, organics and the like on the surfaces in order to reduce a contact resistance.

Contacting surfaces to be cleaned are irradiated with an energy wave such as plasma, accelerated ion beam, fast atom beam (FAB), radical beam and laser in vacuo to remove oxides, organics and the like. This cleaning treatment may be carried out by using any apparatuses as far as they can irradiate the above energy wave on a predetermined area in vacuo.

The first embodiment of the present semiconductor device is characterized in that each of the one or more electrodes formed on the first substrate and each of the one or more electrodes correspondingly formed on the second substrate are electrically connected via elastic bumps.

Usually, when bumps are formed on electrodes on a substrate, heights of the bumps disperse. In the case of conventional semiconductor device without a frame member for hermetically sealing, since electrical connection is achieved by solder bonding bumps and corresponding electrodes, dispersion in bump heights should be absorbed by a thickness of a solder layer.

On the other hand, in the semiconductor device of the present invention, since the frame member is bonded to substrates, when bump heights disperse, electrical connections between bumps and electrodes cannot be achieved while maintaining a sufficient hermetic seal. However, since the frame member and bumps are formed in different patterns, it is difficult to level their heights. Furthermore, even when heights of the frame member and electrodes could be leveled in one substrate, if there is a difference in heights between electrode surfaces and a pattern area corresponding to the frame member on the other substrate, it is difficult to adjust ideally the heights of the frame member and the electrodes to achieve a sufficient hermetic seal and a reliable electrical connection.

Accordingly, in the first embodiment of the present semiconductor device, elastic bumps are used to absorb dispersion in bump heights due to their elasticity.

In addition, according to the present invention, when a frame member is bonded to a substrate, since elastic bumps are compressed and contact with corresponding electrodes, electrical connection can be achieved without bonding the bumps to corresponding electrodes. Additionally, since a frame member is bonded to substrate, unlike the conventional semiconductor device, the present semiconductor device can be made without bonding bumps to corresponding electrodes.

In the first embodiment, a spring constant of the above elastic bumps is low, for example, 1000 N/m or lower. Since the spring constant is low, a pressure applied to an electrode pad formed on the semiconductor chip and the wiring board due to repulsion from bumps can be reduced when the semiconductor is mounted on the wiring board to compress bumps and, thereby, a wiring layer beneath the electrodes is not damaged so that the reliability of the semiconductor device can be improved.

The second embodiment of the present semiconductor device is characterized in that each of the electrodes formed on the first substrate and each of the electrodes correspondingly formed on the second substrate are electrically connected via a bumpless connection.

When electrode patterns become highly dense and fine, it is very difficult to form bumps as used in the first embodiment on the electrodes. In addition, it is preferred that heterogeneous materials between electrodes are excluded in order to prevent properties of materials from changing due to a diffusion reaction during bonding to secure the reliability of the semiconductor device.

Accordingly, in the second embodiment of the present semiconductor device, an electrical connection is achieved by directly contacting electrodes without using bumps.

In this embodiment, since heights for the frame member and the electrodes can be uniformized by using a technique such as a chemical mechanical polishing to level them, a reliable electrical connection can be achieved while maintaining a sufficient hermetic seal.

In the second embodiment, at least one of the first substrate and the second substrate or both the first and the second substrate is made to have a thickness of 50 µm or lower.

In the second embodiment, unlike the first embodiment, contacting parts between formed on two substrates is constructed a bumpless connection and, thereby, a thermal stress caused by a difference in thermal expansion coefficients between the two substrates should be buffered by bending of the substrates. Therefore, in order to secure reliability of a semiconductor device, substrates should be thinned as far as possible. Further, since electrodes contact directly each other, even when heights of electrodes disperse, direct contacts between electrodes may be insured by thinning substrates until they obtain elasticity.

According to the present invention, since a frame member surrounding electrodes formed on a semiconductor chip and a wiring board is formed and this frame member hermetically seals the electrodes, deterioration of these electrodes is prevented without using a sealing resin so that a high reliable semiconductor can be obtained.

In addition, since an electrical connection is achieved only by contacting electrodes each other without bonding electrodes and the above frame member is removably bonded to the substrates, separation of substrates becomes easy and these substrates can be reused.

BEST MODE OF THE INVENTION

The First Embodiment

The first embodiment of the present semiconductor device is made by mounting a fist substrate on a second substrate, wherein electrodes formed on the first substrate and electrodes formed on the second substrates are electrically connected via bumps.

Examples include a semiconductor package in which a semiconductor chip of a Si substrate and an interposer of a Si substrate are connected via bumps.

Figure 1:
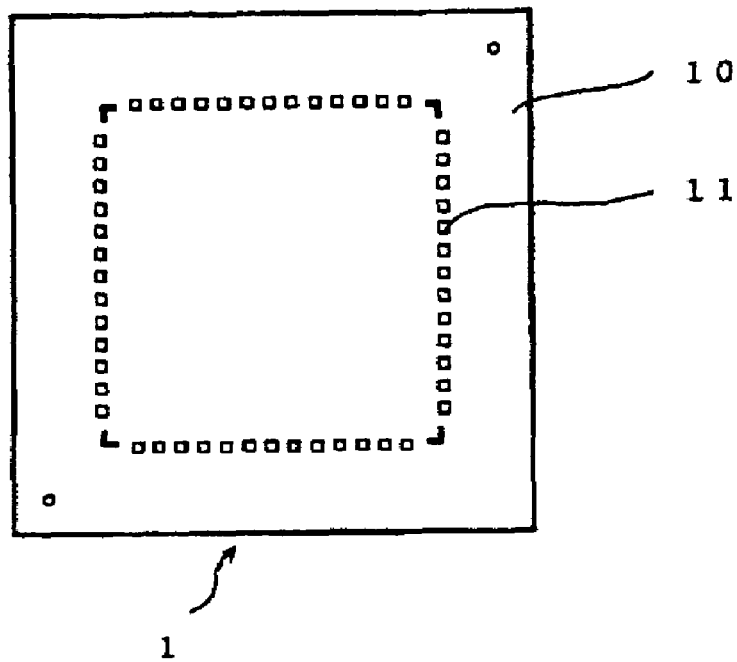
FIG. 1 shows plan views of a semiconductor chip (a) and an interposer (b) used in a semiconductor device of the present invention.
Figure 1:
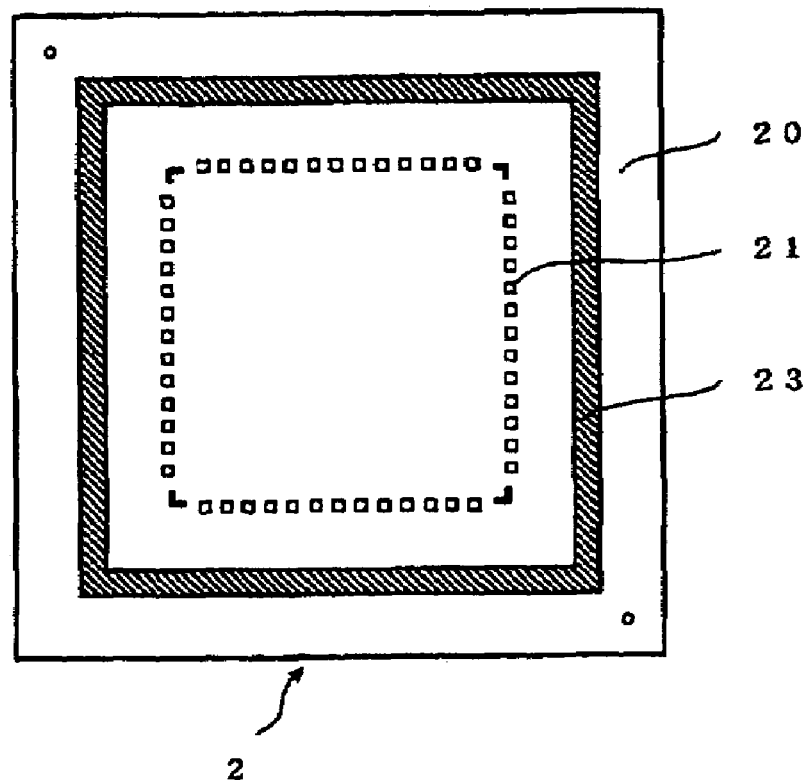

As shown in FIG. 1(a), on a Si substrate 10 of a semiconductor chip 1, one or more electrodes 11 and other circuits (not shown) are formed by using conventional materials and a conventional process.

As shown in FIG. 1(b), on a Si substrate 20 of an interposer 2, one or more electrodes 21 and other circuits (not shown) are formed by using conventional materials and a conventional process. A frame member 23 surrounding the one or more electrodes 21 is further formed.

Figure 2:
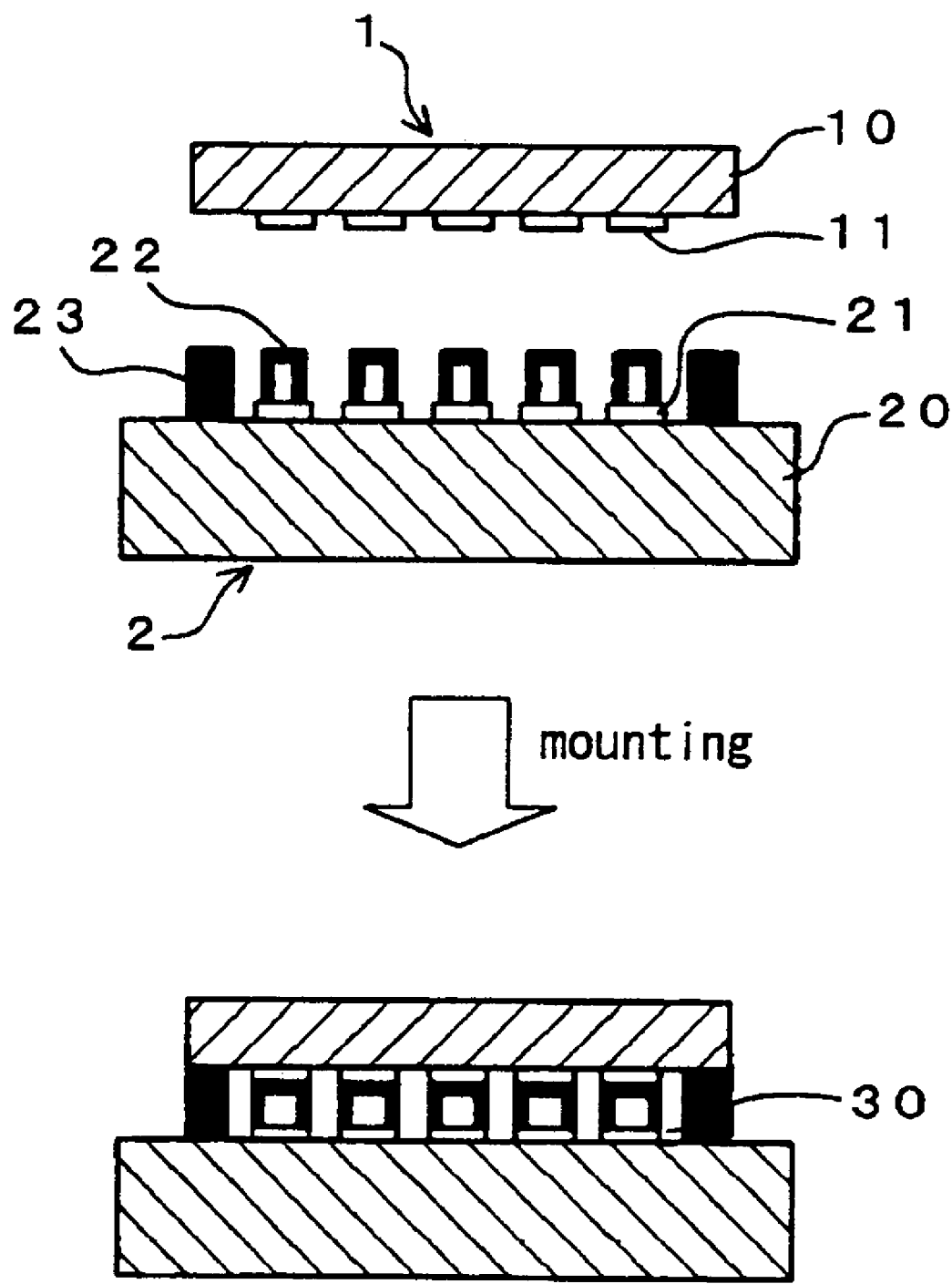
FIG. 2 shows a schematic illustration explaining a mounting step for the first embodiment of the present semiconductor device.

As shown in FIG. 2, elastic bumps 22 are bonded on each of the one or more electrodes 21. Since layout of the electrodes 11 formed on the Si substrate 10 corresponds to layout of the electrodes 21 formed on the Si substrate 20, when the semiconductor chip 1 is mounted on the interposer 2 by bonding the frame member 23 to the Si substrate 10, each of the one or more electrodes 11 formed on the Si substrate 10 contacts with surfaces of the bumps 22 correspondingly formed on the Si substrate 20 to achieve an electrical connection.

As used herein, a term "corresponding", "correspond to" or "correspondingly" means that electrodes formed on a first substrate and electrodes formed on a second substrate have a positional relationship where they can be electrically connected when the first substrate is mounted on the second substrate.

Figure 3:
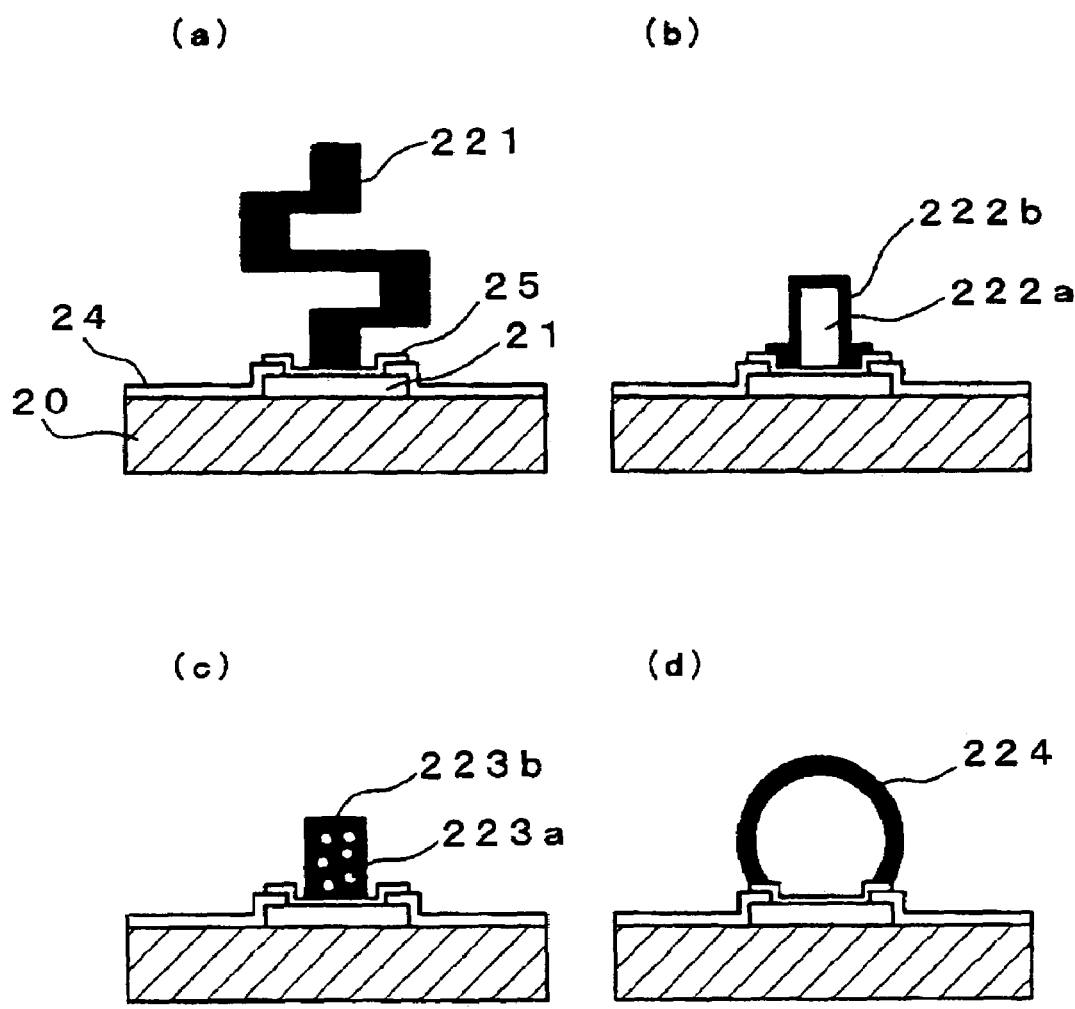
FIG. 3 shows cross-sectional views of elastic bumps used in the present invention.

FIG. 3 shows cross-sectional views of exemplary combinations of an electrode and a bump formed on the interposer 2. The interposer 2 is made by forming electrodes 21 and other circuits on the Si substrate 20 and forming a protective layer 24 on a region other than a region where electrical connection will be formed.

Bumps 22 may be formed directly on the electrodes 21, but it is preferred that an intermediate layer 25 is formed on the electrodes 21, and then the bumps 22 are formed thereon for purposes of preventing components from diffusing between the electrodes 21 and the bumps 22 and improving an adhesion strength therebetween.

Elastic bumps may be formed by depositing on electrodes formed on a substrate by using a conventional process such as lithography, or by fabricating bumps separately and bonding these bumps on electrodes formed on a substrate by using a conventional process or the above-mentioned surface activated bonding.

In the present invention, bumps in any shape may be used as far as they have elasticity. For example, a spring bump 221 shown in FIG. 3(a), resin core-type bumps 222 and 223 shown in respective FIGS. 3(b) and 3(c), a hollow bump 224 shown in FIG. 3(d) and the like may be used.

FIG. 3(a) shows a spring bump 221 having a crank-shape spring structure as one embodiment, but a U-shape or coil-like spring structure may also be used. FIG. 3(b) shows one embodiment of resin core-type bumps. A resin core-type bump 222 is made by disposing a resin core 222a on the electrode 21 and forming an electrically-conductive layer 222b thereon to allow electrical connection. FIG. 3(c) shows another embodiment of resin core-type bumps. This resin core-type bump 223 has a structure in which a plurality of resin beads 223a are dispersed in an electrically-conductive material 223b. FIG. 3(d) shows one embodiment of hollow bumps. This hollow bump 224 has a structure in which a cavity is formed inside an electrically-conductive bump.

Specifically, the resin core-type bump 222 is made by forming a resin core 222a on the intermediate layer 25 using a polyimide photo-sensitive resin, and forming an electrically-conductive coating 222b around the resin core 222a by Ni plating.

The frame member 23 may be formed with materials which can form a thick layer by plating, such as Sn, Pb, Au or alloys thereof, Cu or Ni. Further, after forming the frame member, its surface may be covered with a material which can be easily bonded.

Bonding of the frame member 23 may be appropriately carried out by using a technique such as heat bonding, surface activated bonding and the like. For example, when the frame member 23 is formed by Ni plating, it may be bonded to the Si substrate 10 by soldering.

As shown in FIG. 2, a height of the frame member 23 formed on the Si substrate 20 is adjusted so that surfaces of the bumps 22 contact with the electrodes 11 formed on the Si substrate 10 to achieve an electrical connection when the frame member 23 is bonded to the Si substrate 10. On this purpose, for example, the sum of heights for the electrode 11, the bump 22 and the electrodes 21 is set to be slightly larger than the height of the frame member 23. Therefore, when the semiconductor chip 1 is mounted on the interposer 2, the bumps 22 are compressed and surfaces of the bumps 22 contact with the electrodes on the substrate to achieve an electrical connection.

In the case where a plurality of bumps are bonded on a substrate by a conventional process, since a maximum difference in bump height within one substrate is about 1 µm due to dispersion, when a semiconductor chip is mounted on a wiring board on which a plurality of bumps are bonded, the highest bump should be compressed by at least 1 µm in order to contact all of the plurality of bumps with electrodes. If a conventional bump is used here, a pressure applied to an electrode pad formed on a semiconductor chip and a wiring board due to repulsion from a compressed bump is calculated to be about 50 gf. When a semiconductor chip or a wiring board is thinned depending on a progress in downsizing and thinning of a semiconductor device, applying of the above stress to the electrode pads leads to a breakdown of the semiconductor device. Therefore, a pressure applied to an electrode pad should be reduced.

Therefore, in the present invention, a maximum difference in height for a plurality of bumps and a frame member is set within 1 m. That is, the largest compressed length of the highest bump is 1 µm by mounting a semiconductor chip 1 to an interposer 2. If a maximum permissive pressure per electrode pad is set to for example 1 gf, a permissive spring constant k of the bump is calculated to be 1000 N/m or lower.

Accordingly, in the present invention, a spring constant is preferably 1000 N/m or lower.

Since the spring constant is low, a pressure applied to an electrode pad formed on the semiconductor chip and the wiring board due to repulsion from bumps can be reduced when the semiconductor is mounted on the wiring board to compress bumps and, thereby, a wiring layer beneath the electrodes is not damaged so that the reliability of the semiconductor device can be further improved.

By bonding the frame member 23 to the Si substrate 10, electrodes formed on the Si substrate 10 and the Si substrate 20 are hermetically sealed with the frame member 23 to form a space 30 within the frame member. The inside of the space 30 is maintained vacuous, that is, under a condition where an air pressure is below an atmospheric pressure. Alternatively, a gas which does not react with the electrodes such as an inert gas, for example, nitrogen, argon or a mixture thereof is enclosed within the space 30.

Since surroundings of the electrodes are vacuous or in a gas atmosphere which does not react with the electrodes, it is impossible that electrodes deteriorate to destroy the electrical connection.

The Si substrate 20 is positioned so that surfaces of these bumps 22 can contact with each of the corresponding electrodes 11 formed on the Si substrate 10 and, after that, the semiconductor chip 1 is mounted to the interposer 2 by bonding the frame member 23 formed on the Si substrate 20 to the semiconductor chip 10 to make the first embodiment of the semiconductor device shown in FIG. 2.

In this embodiment, the surfaces of electrodes 11 on the Si substrate 10 and the surfaces of resin core-type bumps 222 formed on the Si substrate 20 may be cleaned by irradiating these surfaces with an argon fast atom beam to remove oxides and organics in a cleaning chamber (not shown) in which an argon fast atom beam can be irradiated in vacuo.

Thereby, a contact resistance between electrodes is reduced.

In this embodiment, a frame member 12 may be formed on the Si substrate 10 and the frame member 12 may be bonded to the Si substrate 20. Alternatively, frame members may be formed on both the Si substrate 10 and the Si substrate 20 and, then, these two frame member may be bonded. Further, elastic bumps 12 may be formed on electrodes 11 on the Si substrate 10 and, the bumps 12 and the electrodes 21 formed on the Si substrate 20 may be contacted to achieve an electrical connection.

The Second Embodiment

The second embodiment of the present semiconductor device is made by mounting a fist substrate on a second substrate, wherein electrodes formed on the first substrate and electrodes formed on the second substrate are electrically connected via a bumpless connection.

Examples include a semiconductor package in which a semiconductor chip of a Si substrate and an interposer of a Si substrate is connected via a bumpless connection.

Figure 4:
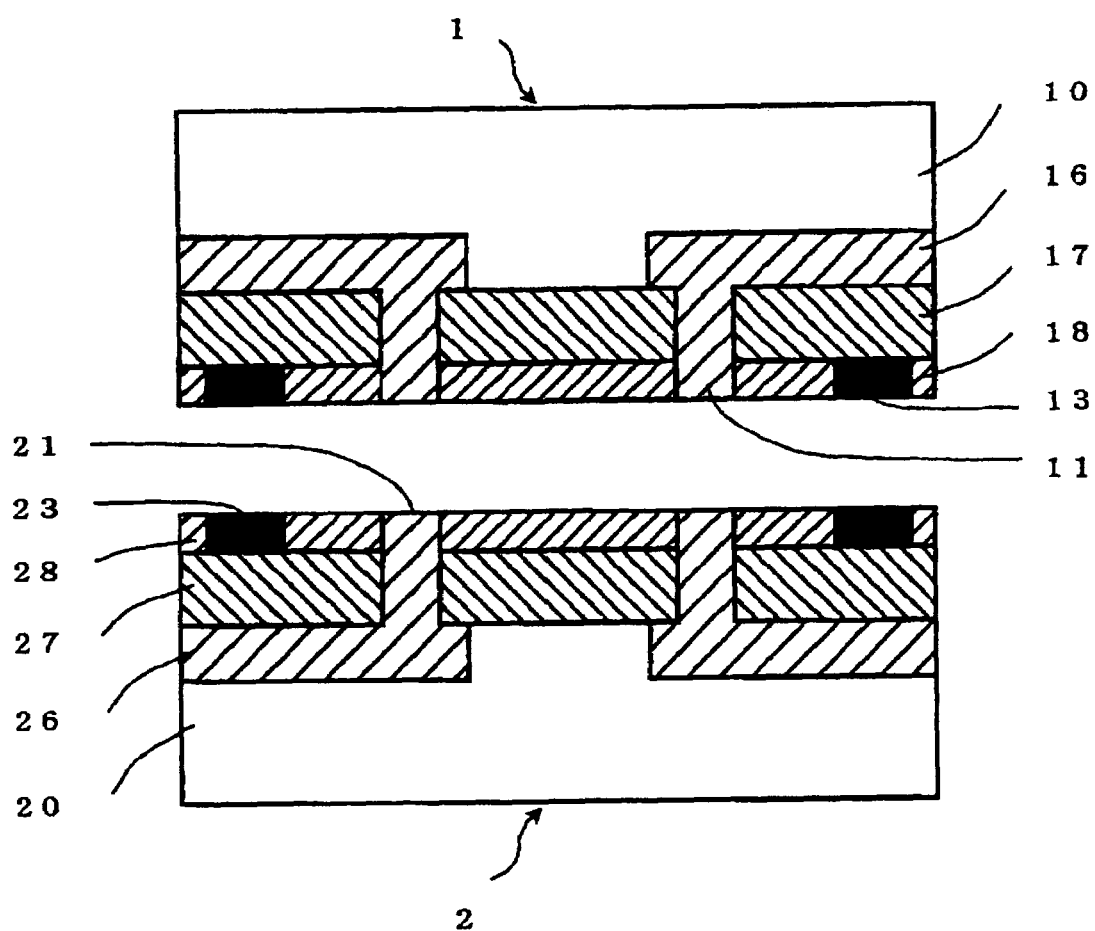
FIG. 4 shows cross-sectional views of two substrates constituting the second embodiment of the present semiconductor device.

As shown in FIG. 4, on a Si substrate 10 of a semiconductor chip 1, one or more electrodes 11 and other circuits are formed by using conventional materials and a conventional process. More specifically, on the Si substrate 10, a wiring layer 16 of a semiconductor element is formed, and an insulating layer 17 is formed thereon. Further, on the insulating 17, a ground wiring layer 18 is formed.

Through holes are formed through the insulating layer 17 and the ground wiring layer 18, which reach to the wiring layer 16. The electrodes 11 are electrically connected with the wiring layer 16 via connectors formed within the through holes.

In addition, a through hole is formed through the ground wiring layer 18, which reaches to the insulating layer 17. A frame member 13 formed in the through hole surrounds the one or more electrodes 11.

The frame member 13 may be formed with materials which can form a thick layer by plating, such as Sn, Pb, Au or alloys thereof, Cu or Ni.

A surface of the frame member 13 may be covered with a material which can be easily bonded.

Similar to the semiconductor chip 1, a wiring layer 26, an insulating layer 27 and a ground wiring layer 28 are formed also on the Si substrate 20 of the interposer 2, and a frame member 23 surrounding the one or more electrodes 21 is further formed.

Since layout of the electrodes 11 formed on the Si substrate 10 corresponds to layout of the electrodes 21 formed on the Si substrate 20, the semiconductor chip 1 is mounted on the interposer 2 by bonding the frame member 13 and the frame member 23 so that each of the one or more electrodes 11 formed on the Si substrate 10 contact with each of the one or more electrodes 21 correspondingly formed on the Si substrate to achieve an electrical connection.

Bonding of frame members may be appropriately carried out by using a technique such as heat bonding, surface activated bonding and the like. For example, when the frame member 13 and the frame member 23 are formed by Ni plating, the frame members may be bonded each other by soldering.

In the second embodiment, at least one of the first substrate and the second substrate, and desirably both the substrates are thinned as far as possible to invest these substrates themselves with elasticity. By this, contacting between each of a plurality of electrodes 11 and each of a plurality of electrodes 21 can be ensured. In addition, since a thermal stress may be buffered even when two substrates are formed with different materials, the reliability of a semiconductor device is improved. For example, substrates are made to have a thickness of 50 µm or lower, preferably 30 µm or lower.

By bonding the frame member 13 and the frame member 23, electrodes 11 and 21 are hermetically sealed with the frame members to form the space 30 within the frame members. The inside of the space 30 is maintained vacuous, that is, under a condition where an air pressure is below an atmospheric pressure. Alternatively, a gas which does not react with the electrodes such as an inert gas, for example, nitrogen, argon or a mixture thereof is enclosed within the space 30.

Since surroundings of the electrodes are vacuous or in a gas atmosphere which does not react with the electrodes, it is impossible that electrodes deteriorate to destroy the electrical connection.

In this embodiment, these surfaces may be cleaned by irradiating the surfaces of electrodes 11 on the Si substrate 10 and the surfaces of electrodes 21 on the Si substrate 20 with an argon fast atom beam to remove oxides and organics in a cleaning chamber (not shown) in which an argon fast atom beam can be irradiated in vacuo.

Thereby, a contact resistance between electrodes is reduced.

In this embodiment, only the frame member 13 may be formed on the Si substrate 10 and this frame member 13 may be bonded to the Si substrate 20. Alternatively, only the frame member 23 may be formed on the Si substrate 20 and this frame member 23 may be bonded to the Si substrate 10.

Although the semiconductor device of the present invention and the process for manufacturing the same have been explained by using exemplary embodiments, they only illustrate the present invention and do not intend to limit the present invention.

What we claimed is:

1. A semiconductor device which comprises
a first substrate on which one or more electrodes are formed, a second substrate on which one or more electrodes are formed, and a frame member,
wherein each of the one or more electrodes formed on the first substrate and each of the one or more electrodes correspondingly formed on the second substrate are electrically connected;
wherein the frame member surrounds the electrodes formed on the first and the second substrates to hermetically seal these electrodes;
the first and the second substrates are bonded via the frame member; and
wherein electrical connections between each of the one or more electrodes formed on the first substrate and each of the one or more electrodes correspondingly formed on the second substrate are achieved by contacting those electrodes without bonding these electrodes.

2. The semiconductor device according to claim 1, wherein the inside of the frame member is vacuous.

3. The semiconductor according to claim 1, wherein the frame member encloses either of a nitrogen gas, an inert gas or a mixture thereof.

4. The semiconductor device according to claim 1, wherein the frame member is removably bonded to at least one of the first substrate and the second substrates.

5. The semiconductor device according to claim 4, wherein the frame member is bonded to at least one of the first and the second substrates with solder.

6. The semiconductor device according to claim 1, wherein surfaces of the electrodes formed on the first and the second substrates are cleaned.

7. The semiconductor device according to claim 1, wherein each of the one or more electrodes formed on the first substrate and each of the one or more electrodes correspondingly formed on the second substrate are electrically connected via elastic bumps.

8. The semiconductor device according to claim 7, wherein a spring constant of the elastic bumps is 1000 N/in or lower.

9. The semiconductor device of claim 7, wherein a first elastic bump on a first electrode on the first substrate is electrically connected to a second electrode on the second substrate, and wherein a height H1 of the combination of the first bump and first electrode on the first substrate is greater than a height H2 of a frame member on the first substrate, so that the first bump is compressed when electrically connected to the second electrode.

10. The semiconductor device according to claim 1, wherein each of the electrodes formed on the first substrate and each of the electrodes correspondingly formed on the second substrate are electrically connected via a bumpless connection.

* * * * *

UNITED STATES PATENT AND TRADEMARK OFFICE
CERTIFICATE OF CORRECTION

PATENT NO. : 7,301,243 B2  Page 1 of 1
APPLICATION NO. : 11/212912
DATED : November 27, 2007
INVENTOR(S) : Suga et al.

It is certified that error appears in the above-identified patent and that said Letters Patent is hereby corrected as shown below:

On the Title Page

(73) Assignees:

Please correct the second Assignee to read as follows:

-- Tadatomo Suga --.

Signed and Sealed this

Twenty-ninth Day of April, 2008

JON W. DUDAS
*Director of the United States Patent and Trademark Office*